(12) United States Patent
Ikegawa et al.

(10) Patent No.: US 11,378,637 B2
(45) Date of Patent: Jul. 5, 2022

(54) MAGNETIC RESONANCE IMAGING APPARATUS AND CONTROL PROGRAM THEREFOR

(71) Applicant: Hitachi, Ltd., Tokyo (JP)

(72) Inventors: Ayaka Ikegawa, Tokyo (JP); Masahiro Takizawa, Tokyo (JP); Hisako Nagao, Tokyo (JP); Tomohiro Gotou, Tokyo (JP)

(73) Assignee: FUJIFILM HEALTHCARE CORPORATION, Chiba (JP)

( * ) Notice: Subject to any disclaimer, the term of this patent is extended or adjusted under 35 U.S.C. 154(b) by 0 days.

(21) Appl. No.: 17/205,683

(22) Filed: Mar. 18, 2021

(65) Prior Publication Data

US 2021/0364586 A1 Nov. 25, 2021

(30) Foreign Application Priority Data

May 19, 2020 (JP) .............................. JP2020-087679

(51) Int. Cl.
*G01R 33/54* (2006.01)
*G01R 33/56* (2006.01)

(52) U.S. Cl.
CPC ....... *G01R 33/543* (2013.01); *G01R 33/5608* (2013.01)

(58) Field of Classification Search
USPC ........................................................ 324/309
See application file for complete search history.

(56) References Cited

U.S. PATENT DOCUMENTS

| | | | | |
|---|---|---|---|---|
| 8,115,485 B1* | 2/2012 | Maier | ................... | G01R 33/543 |
| | | | | 324/309 |
| 2007/0024281 A1* | 2/2007 | Fuderer | ................... | G06T 5/006 |
| | | | | 324/309 |
| 2018/0329004 A1* | 11/2018 | Imai | ................... | G01R 33/543 |
| 2021/0080531 A1* | 3/2021 | Gui | ................... | G01R 33/543 |
| 2021/0128084 A1* | 5/2021 | Dai | ................... | G06N 3/08 |
| 2021/0196225 A1* | 7/2021 | Li | ................... | A61B 6/00 |
| 2021/0212642 A1* | 7/2021 | Nett | ................... | A61B 6/5205 |
| 2022/0008141 A1* | 1/2022 | Chopra | ................... | A61B 6/504 |
| 2022/0015710 A1* | 1/2022 | Lewis | ................... | A61B 5/706 |

FOREIGN PATENT DOCUMENTS

JP 2017-113164 A 6/2017

\* cited by examiner

*Primary Examiner* — Rodney E Fuller
(74) *Attorney, Agent, or Firm* — Mattingly & Malur, PC

(57) ABSTRACT

Imaging failure of a positioning image due to the difference in the position or the size of a subject placed in the examination space is prevented, and accordingly, the extension of the examination time is prevented. A pre-scan for appropriately setting the imaging position for positioning imaging is automatically performed prior to the positioning imaging and the main imaging of an MRI apparatus, and a region where an examination part of a subject is present (the extent of the examination part) is detected using the measurement data. By using the detected extent of the examination part, it is possible to subsequently determine the imaging position or calculate the scan parameters used for imaging.

8 Claims, 12 Drawing Sheets

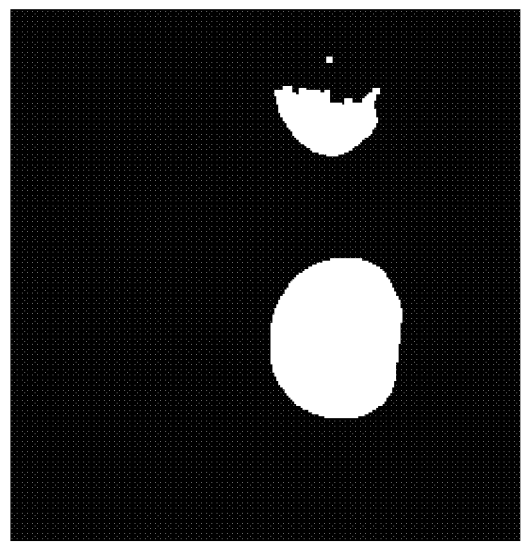
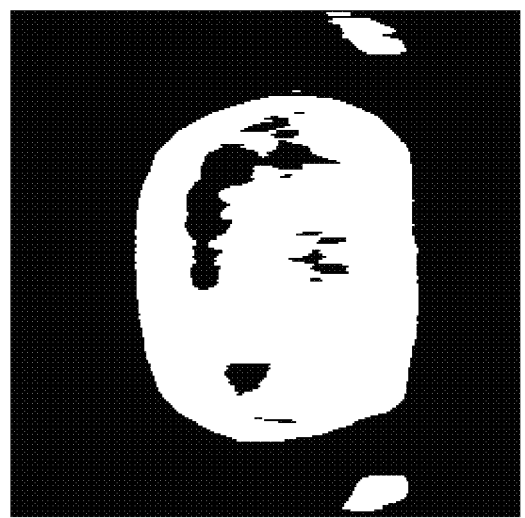

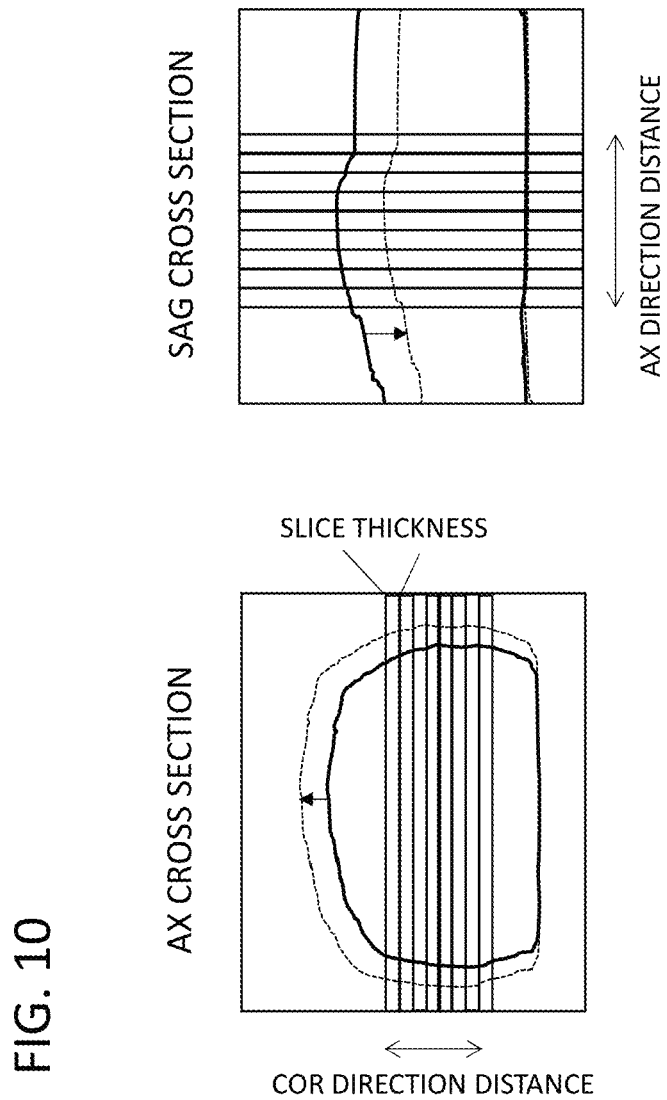

MAGNETIC RESONANCE IMAGING APPARATUS AND CONTROL PROGRAM THEREFOR

INCORPORATION BY REFERENCE

The present application claims priority from Japanese patent application JP-2020-087679 filed on May 19, 2020, the content of which is hereby incorporated by reference into this application.

BACKGROUND OF THE INVENTION

Field of the Invention

The present invention relates to a magnetic resonance imaging apparatus and a control program therefor.

Description of the Related Art

A magnetic resonance imaging (hereinafter, referred to as MRI) apparatus is an apparatus that measures a nuclear magnetic resonance (NMR) signal generated by nuclear spins forming the tissues of a subject, especially, the human body, and images the shapes or tissues of the head, abdomen, limbs, and the like in a two-dimensional or three-dimensional manner.

In an examination using the MRI apparatus, an anatomically determined cross section is usually imaged for each examination target part, but the body shape of the subject or the posture on the bed is different for each examination. For this reason, even when the same imaging sequence is executed or the same analysis processing is performed, user's complicated manual operations, such as setting and adjusting the imaging position of the subject and capturing an image for adjusting scan parameters, are required each time an examination is performed. In addition, in the case of improper adjustment, there is a possibility of re-imaging, which interferes with a smooth examination.

Therefore, for example, JP-A-2017-113164 discloses a technique for calculating a region where folding artifacts appear for a captured image and automatically calculating the enlargement rate of the imaging field of view (FOV) and the ratio of the rectangular field of view to minimize the extension of the imaging time.

However, the above technique described in JP-A-2017-113164 is limited to automatically calculating some (ratio of rectangular field of view) of scan parameters from a positioning image (a scanogram or a scout image) or a dedicated pre-scan image. Therefore, the calculation accuracy of the scan parameter depends on the accuracy of the position of the positioning image or the dedicated pre-scan image, and re-imaging cannot be avoided when the offset of the subject with respect to the FOV is large.

In addition, with the development of new technology such as a function of automatically moving the bed into the gantry and automatically stopping the bed at the position of the examination part, as shown in FIG. 12A, the failure of imaging due to mismatch between the set position of the subject and the imaging position registered in advance in the apparatus and the re-capturing of images due to the imaging failure increase.

Usually, in an examination using the MRI apparatus, the user should not only generate and check an image for diagnosis but also monitor the physical condition, and the like of the subject. In addition to this, there is a problem that the examination efficiency is lowered when a re-imaging operation is performed at the time of failure of the setting of the subject imaging conditions or the capturing of a positioning image.

SUMMARY OF THE INVENTION

The invention has been made in view of the above circumstances, and it is an object of the invention to make it possible to perform imaging at the center of an image regardless of a subject as shown in FIG. 12B by optimizing scan parameters before image capturing and accordingly to reduce a burden on the user due to manual operation and to prevent the extension of the examination time due to re-imaging, thereby improving the examination efficiency.

In order to solve the aforementioned problems, in the invention, a pre-scan for appropriately setting the imaging position for positioning imaging is automatically performed prior to the positioning imaging and the main imaging, and a region where an examination part of a subject is present (the extent of the examination part) is detected using the measurement data. By using the detected extent of the examination part, it is possible to subsequently determine the imaging position or calculate the scan parameters used for imaging.

That is, an MRI apparatus of the invention includes: an imaging unit that images a predetermined examination part of a subject according to imaging conditions stored in a storage device that stores imaging conditions for each examination part; and a calculation unit that controls an operation of the imaging unit and performs a calculation related to imaging. The calculation unit controls the imaging unit to perform a pre-scan for measuring an extent of the examination part of the subject, and calculates the extent of the examination part using measurement data obtained by the pre-scan.

In addition, the invention provides a program causing a computer to execute: a step of causing an imaging unit of an MRI apparatus to perform a pre-scan for measuring an extent of an examination part of a subject; a step of calculating the extent of the examination part for an axial surface of the subject and a surface perpendicular to the axial surface using measurement data obtained by the pre-scan; and a step of calculating imaging conditions when the imaging unit images the examination part using the calculated extent of the examination part.

According to the invention, the offset amount and various scan parameters for each subject are calculated, and the calculation results are automatically reflected in the imaging to prevent the imaging time from being extended by optimizing the imaging position. In addition, by eliminating the manual operation of the user, the work burden is reduced. By shortening the time and reducing the work burden, the examination efficiency can be improved.

BRIEF DESCRIPTION OF THE DRAWINGS

FIGS. 7A and 7B are diagrams showing examples of a mask in the steps of FIG. 6, where FIG. 7A shows an example of a mask of an AX cross-sectional image of the abdomen and FIG. 7B shows an example of a mask of an AX cross-sectional image of the knee;

FIG. 10 is a diagram describing the calculation of scan parameters (the number of slices and the slice thickness);

FIG. 12A is a diagram showing a case where positioning imaging fails and FIG. 12B is a diagram showing a case where the invention is applied.

DETAILED DESCRIPTION OF THE INVENTION

Figure 1:
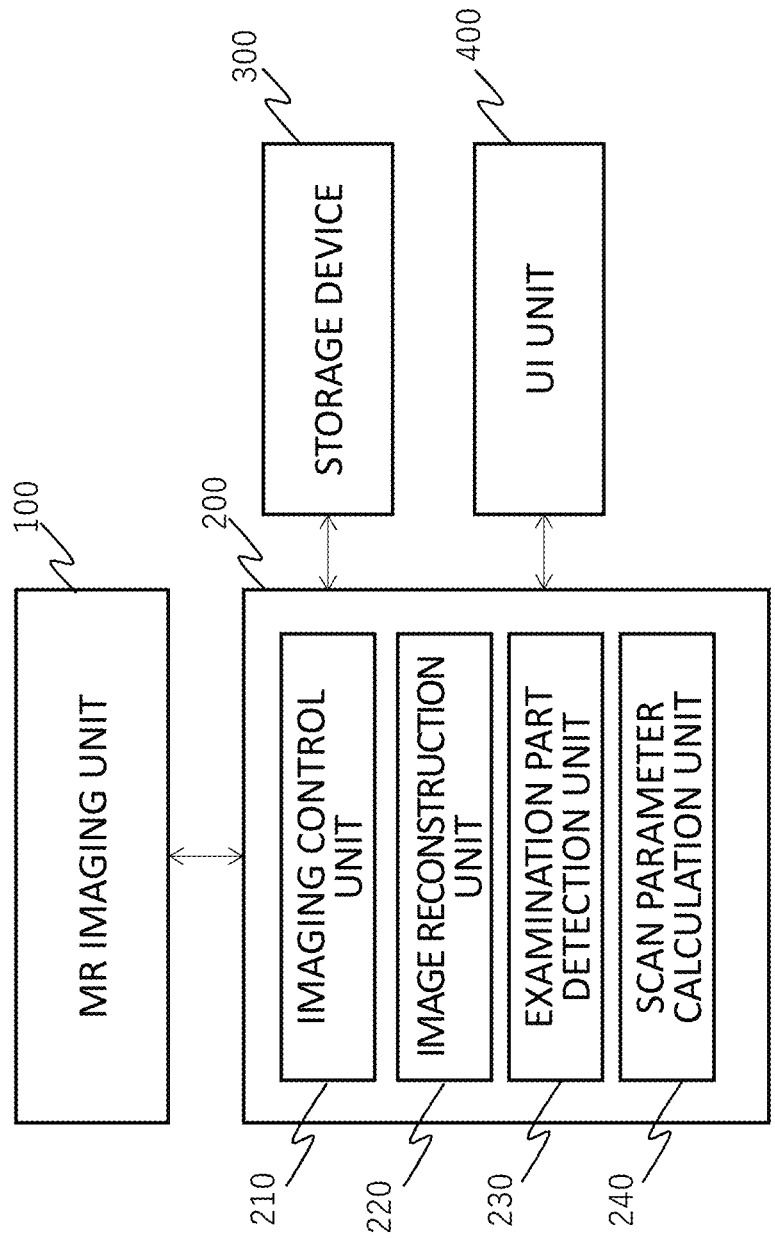
FIG. 1 is a diagram showing the overall configuration of an MRI apparatus.

Hereinafter, an MRI apparatus according to an embodiment of the invention will be described with reference to the diagrams. In addition, in all the diagrams for describing the embodiment of the invention, those having the same function are denoted by the same reference numerals, and the repeated description thereof will be omitted.

As shown in FIG. 1, the MRI apparatus of the present embodiment mainly includes: an imaging unit 100 that generates nuclear magnetic resonance in a subject and collects an NMR signal; a calculation unit 200 that controls the operation of the imaging unit 100 and performs various calculations including image reconstruction using the NMR signal collected by the imaging unit 100; a storage device 300 that stores data required for the processing of the imaging unit 100 or the calculation unit 200, processing results, and the like; and a user interface (UI) unit 400 that receives a command or condition settings from the user.

Figure 2:
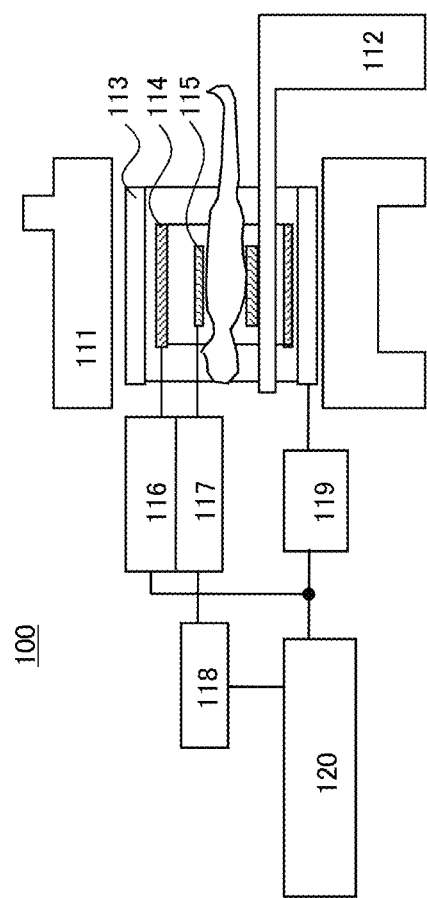
FIG. 2 is a configuration diagram showing an embodiment of an imaging unit.

The configuration of the imaging unit 100 is the same as that of a general MRI apparatus. For example, as shown in FIG. 2, the imaging unit 100 includes: a static magnetic field magnet 111 for generating a uniform static magnetic field in the space where a subject 101 is placed; a gradient magnetic field generating coil 113 for generating a gradient magnetic field in the static magnetic field space formed by the static magnetic field magnet 111; a high-frequency magnetic field coils 114 for applying a high-frequency magnetic field (RF pulse) to the subject placed in the static magnetic field space; and a high-frequency magnetic field coil for reception (reception coil) 115 for receiving a nuclear magnetic resonance signal (echo signal) generated from the subject. These coils are disposed in a gantry 110, and the subject 101 is laid down on a bed 112 and placed in the static magnetic field space. Usually, the center of the examination part of the subject 101 is disposed so as to match the center of the static magnetic field.

In addition, the imaging unit 100 includes a transmission unit 116 for driving these high-frequency magnetic field coils 114, a gradient magnetic field power supply 119 for driving the gradient magnetic field generating coil 113, a reception unit 117 and a signal processing unit 118 for receiving the echo signal detected by the reception coil 115, and a pulse sequence unit 120. The pulse sequence unit 120 transmits various commands necessary for collecting tomographic image data of the subject to the transmission unit 116, the gradient magnetic field power supply 119, and the reception unit 117 according to a pulse sequence that describes the timing or strength of the high-frequency magnetic field, the gradient magnetic field, and the signal reception.

The calculation unit 200 includes: an imaging control unit 210 that controls the imaging unit 100; an image reconstruction unit 220 that reconstructs an image using an echo signal obtained by imaging of the imaging unit 100; an examination part detection unit 230 that detects an examination part of the subject 101 placed in the gantry 110 and calculates the extent of the examination part, that is, the size of a region occupied by the examination part in the imaging space; and a scan parameter calculation unit 240 that calculates a scan parameter based on the extent of the examination part.

The examination part is a part to be examined, such as the head, chest, abdomen, and extremity. In the protocol, information on the type of pulse sequence used for positioning imaging (scanogram) or main imaging, the imaging cross section, or the imaging position is determined for each examination part. In addition, in the present embodiment, the processing flow of pre-scan and the processing flow after the pre-scan for calculating the extent of the examination part are stored in the storage device 300 as a pre-scan flow for each examination part. In addition, the feature amount of an imaging target part is registered in the storage device 300. The imaging target part is an organ or tissue (for example, blood vessel, joint, lumbar spine, and the like) to be examined, and the feature amount is, for example, a feature of a shape such as an elliptical shape or an elongated shape, a position (for example, how much the position is biased to the right and left or up and down in a predetermined cross section), and a brightness value (for example, whether the imaging target part is bright or dark with respect to surrounding tissues), and is an amount extracted from statistical data.

The UI unit 400 includes an input device, such as a display, a touch panel, a keyboard, and a mouse, and displays an image created by the image reconstruction unit 220, an image obtained during calculation, or a GUI, receives an input from the user through the input device, and transmits the input to the calculation unit 200.

The calculation unit 200 can be constructed on a computer including a CPU, a GPU, and a memory, and each function of the calculation unit 200 is realized by uploading each program to the CPU. However, it is also possible to realize some of the functions with hardware, such as an ASIC or a PFGA.

Figure 3:
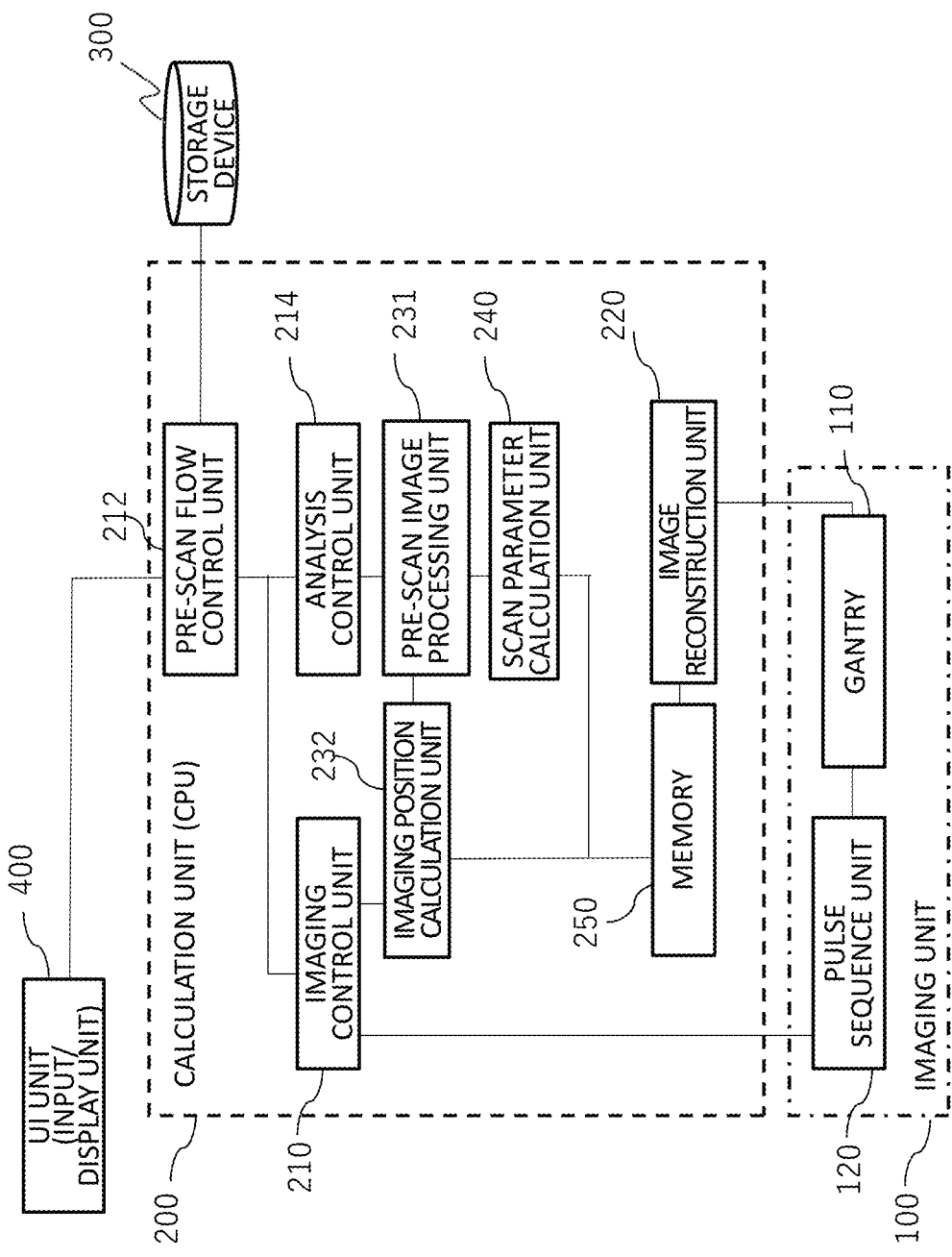
FIG. 3 is a configuration diagram showing an embodiment of a calculation unit.

FIG. 3 shows a configuration example in which the calculation unit 200 is constructed on a computer. In this configuration example, the calculation unit 200 includes, as control functions, a pre-scan flow control unit 212 and an analysis control unit 214 in addition to the imaging control unit 210. In addition, as calculation functions, the calculation unit 200 includes a pre-scan image processing unit 231 and an imaging position calculation unit 232 as functions of the examination part detection unit 230 in addition to the image reconstruction unit 220 and the scan parameter calculation unit 240.

When the user inputs subject information including an examination part through a screen for subject registration displayed on the display of the UI unit 400, the pre-scan flow control unit 212 selects a pre-scan flow that matches the input examination part, among the pre-scan flows stored in the storage device 300, according to the instruction input by the user that has been received by the UI unit 400.

The imaging control unit 210 controls an imaging process in the imaging unit 100 according to the control signal transmitted from the pre-scan flow control unit 212. For example, the imaging control unit 210 controls the imaging unit 100 to perform the selected pre-scan.

The analysis control unit 214 controls processing performed by the examination part detection unit 230, that is, analysis processing different for each cross section to be imaged and each examination part, according to the control signal transmitted from the pre-scan flow control unit 212.

The pre-scan image processing unit 231 creates a pre-scan image based on the measurement data obtained by the pre-scan, and performs predetermined processing. Details of the processing in the pre-scan image processing unit 231 will be described later. The imaging position calculation unit 232 estimates the imaging position of the cross section matching the positioning image or the pre-scan flow based on the pre-scan image processed by the pre-scan image processing unit 231, and transmits a control signal to the imaging control unit 210. The scan parameter calculation unit 240 estimates scan parameters of the main imaging using the processed image transmitted from the pre-scan image processing unit 231 and a method to be described later.

A memory 250 functions as a work area in the calculation or processing of each of the units described above, and temporarily stores the created image or the intermediate process of the calculation processing. In addition, a subject information registration unit for registering the information of the subject input by the user through the UI unit 400 is provided in the memory 250 or the storage device 300.

Figure 4:
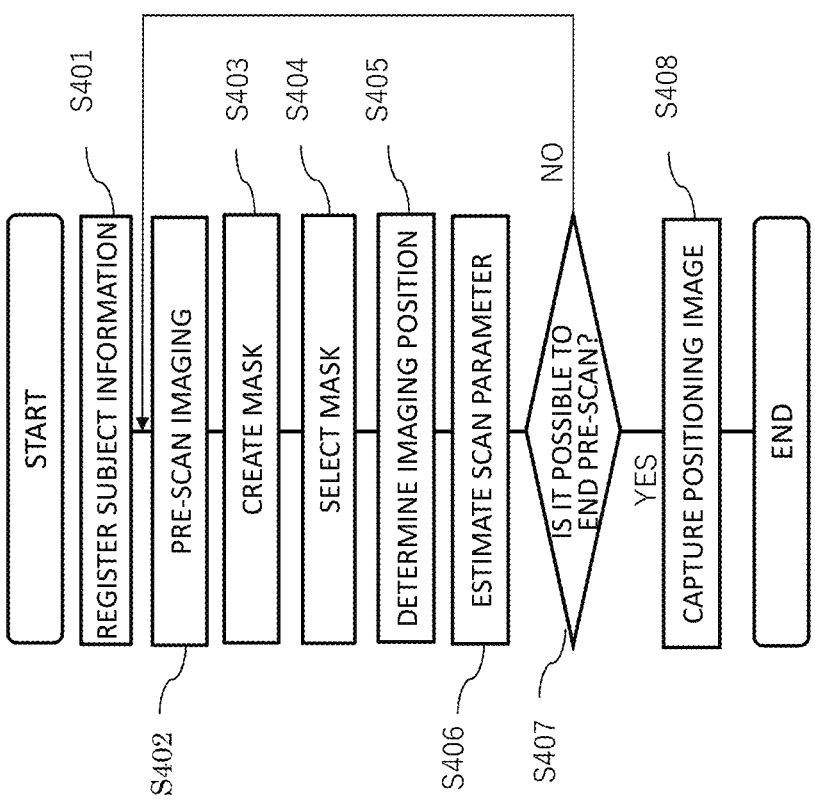
FIG. 4 is a flowchart showing the operation flow of the MRI apparatus of the embodiment.

Next, the operation flow of the MRI apparatus of the present embodiment will be described. FIG. 4 shows an example of the overall flow.

<Step S401>

First, at the beginning of an examination, an operator registers subject information using the UI unit 400. The information includes information, such as an examination part and an imaging target part, in addition to the name, age, and gender, and is stored in the memory 250 (subject information registration unit). The information on the examination part includes information on the head, abdomen, shoulder, and the like, and the information on the imaging target part includes information on a more specific tissue or part.

<Step S402>

Then, in order to determine the offset amount and scan parameters for each subject, pre-scan imaging for detecting the extent of the examination part is performed. The pre-scan imaging is automatically started, for example, after the movement of the bed is completed or after the examination room door is closed.

Figure 5:
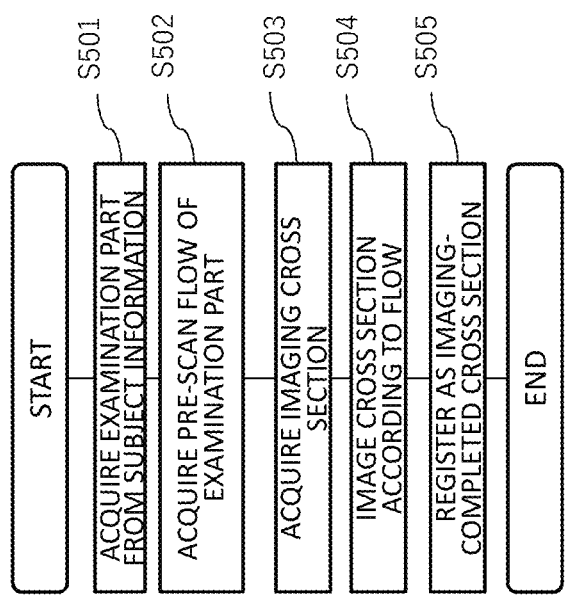
FIG. 5 is a flowchart showing the detail of step S402 (pre-scan imaging) among the steps of FIG. 4.

The imaging unit 100 performs pre-scan imaging according to the flow of FIG. 5, for example.

First, the information on the examination part registered in the memory 250 (subject information registration unit) is acquired (step S501). From the information on the examination part, comparison with the list of pre-scan flows for the examination part stored in the storage device 300 in advance is performed to acquire the target pre-scan flow (step S502). The imaging cross section is acquired from the pre-scan flow (step S503). The imaging cross section is, for example, one to three cross sections selected from an axial (AX) cross section, a sagittal (SAG) cross section, and a coronal (COR) cross section. In the pre-scan flow, which imaging cross section is to be acquired in what order is set in advance for each examination part. In the pre-scan, the imaging cross sections are sequentially acquired according to this setting (step S504).

For the acquired imaging cross sections, the imaging unit 100 captures an image of a wide range of imaging field of view with respect to the examination part at high speed with low resolution. For example, the imaging matrix uses a frequency encoding number of 64, a phase encoding number of 16, and an FOV of 500 [mm]. The imaged cross section is registered as an imaging-completed cross section (step S505), and the pre-scan of each cross section is performed until the pre-scan of imaging cross sections set in the pre-scan flow is completed.

<Step S403>

The pre-scan image processing unit 231 performs analysis processing on the image captured by the pre-scan. In the case of the AX cross section, a mask is created by extracting a high-brightness component on the AX cross-sectional image, that is, a region where the subject is present. In addition, in the case of the SAG cross section or the COR cross section, a mask is created by removing artifacts or noise, which is a low-brightness component, from the image of the SAG or COR cross section.

Figure 6:
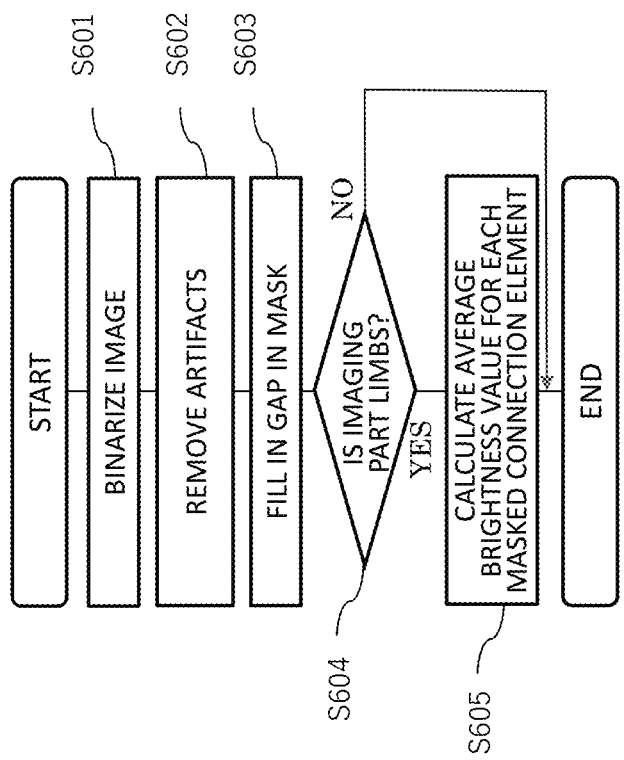
FIG. 6 is a flowchart showing the detail of step S403 (mask creation) among the steps of FIG. 4.

The details of mask creation (processing of the pre-scan image processing unit 231) will be described with reference to FIG. 6. Here, as an example, the case of creating a mask of an AX cross section will be described first.

[Step S601]

The image of the AX cross section is binarized by Equation (1). A threshold value used for binarization can be calculated by, for example, a discriminant analysis method. In this case, an adjustment may be made by adding or subtracting a standard deviation, a correction coefficient, or the like to or from the threshold value calculated based on the features of each cross section and each part using the discriminant analysis method.

[Equation 1]

$$\begin{cases} \text{Mask1}(x, y) = 1 & (S(x, y) \geq \text{Threshold}) \\ \text{Mask1}(x, y) = 0 & (S(x, y) < \text{Threshold}) \end{cases} \quad (1)$$

In Equation 1, $S(x, y)$ is the brightness signal strength of the image of the AX cross section, Threshold is a threshold value calculated for $S(x, y)$ by the discriminant analysis method, and $\text{Mask1}(x, y)$ is a binarized mask image. x is the horizontal coordinate (reconstruction matrix size in the horizontal direction) of the image, and y is the vertical coordinate (reconstruction matrix size in the vertical direction) of the image.

[Step S602]

A process for removing artifacts is performed on the binarized mask. The image obtained by pre-scan is an image (low-resolution image) obtained with a small number of phase encodings, and truncation artifacts are generated due to lack of high-frequency data. Such artifacts can be removed by morphology transformation that repeats dilation processing and erosion processing. Specifically, the erosion and dilation of the image expressed by Equations (2) and (3) are repeated to perform an opening process or a closing process. In this process, for example, one erosion is performed and then one dilation is performed.

[Equation 2]

$$\begin{cases} \text{Mask2}(x, y) = 1 & \left( \sum_{x'=x-1}^{x+1} \sum_{y'=y-1}^{y+1} \text{Mask1}(x', y') = 9 \right) \\ \text{Mask2}(x, y) = 0 & \text{(other)} \end{cases} \quad (2)$$

In Equation (2), Mask2(x, y) is a reduced mask of the morphology transformation.

[Equation 3]

$$\begin{cases} \text{Mask3}(x, y) = 1 & \left( \sum_{x'=x-1}^{x+1} \sum_{y'=y-1}^{y+1} \text{Mask2}(x', y') \geq 1 \right) \\ \text{Mask3}(x, y) = 0 & \text{(other)} \end{cases} \quad (3)$$

In Equation (3), Mask3 (x, y) is an enlarged mask of the morphology transformation.

[Step S603]

In the mask formed as described above, since a low-brightness portion such as air inside the body is determined to be a background and falls out of the mask, a process for making the low-brightness portion be included in the mask is performed. Specifically, when the pixels on the edge included in the mask are connected to each other in the vicinity and forma closed region, the pixel value of the region is set to 1.

[Step S604]

In step S604, using the information of the imaging cross section acquired from the pre-scan flow, it is determined whether this is a part for which both sides or a plurality of targets are to be imaged with the same image, such as a joint. When there are a plurality of cross-sectional images, the process proceeds to step S605. In other cases, the mask creation ends.

[Step S605]

When there are a plurality of cross sections (when a plurality of masks that are not connected to each other are formed), for each cross-sectional image corresponding to each mask, an average brightness value $S_{ave}$ is calculated by dividing the total value of the brightness values in the image by the number of pixels (Equation (4)). [Equation 4]

[Equation 4]

$$S_{ave} = \frac{\sum_x \sum_y S(x, y) \times \text{Mask3}(x, y)}{\sum_x \sum_y \text{Mask3}(x, y)} \quad (4)$$

<Step S404>

For the mask created in step S403 (S601 to S605), a mask corresponding to the examination part is specified.

The mask created in step S403 may include masks of a plurality of cross-sectional images other than the joints. For example, when the abdomen is an examination part, the abdomen and arms may be reflected in the AX cross section as shown in FIG. 7A. In addition, when the knee joint is an examination part, both legs or one leg is reflected in the AX cross section as shown in FIG. 7B. In this step, the features of the mask for each part are compared with the shape or the average brightness value of the mask image and the examination part information stored in the memory or the like to specify the mask corresponding to the examination part.

For example, when the abdomen is an examination part, there is a feature that the mask corresponding to the examination part is present near the center of the image and has an elliptical shape. Therefore, a mask that matches this feature is selected as an abdominal position. In addition, in the joint, since a portion where the reception coil is mounted is a high-brightness (high-sensitivity) portion, the mask of the cross-sectional image having the highest average brightness value described above is used as a mask of the joint. For example, when the leg is an examination part and the right or left side of the examination target is selected as examination part information by the user, the mask of the selected one leg is selected as a target. When neither of the right and left sides is selected, the mask having the highest average brightness value calculated in step S605 above is selected as a target. In addition, when both sides are targets or when there is no difference between the average brightness values of both sides, both sides are specified as targets.

In the SAG cross section or the COR cross section, one mask as a continuous region is usually created, so that the process of this step is unnecessary.

<Step S405>

The pre-scan image processing unit 231 forms masks for all imaging cross sections set in advance, and then transmits the specified mask position to the imaging position calculation unit 232. The imaging position calculation unit 232 calculates a position that will include the imaging target part by using the position information of the mask. For example, when the imaging target part is the lumbar spine, the "position that will include the imaging target part" means a position where a pre-scan is performed with the abdomen and the lumbar region as examination parts to obtain a mask of the AX cross section or the SAG cross section and it is estimated that the lumbar spine (imaging target) is included in the cross section.

The imaging position calculation unit 232 performs position estimation for the imaging position from the anatomical position known empirically or statistically by using the information of the imaging target part. For example, in the case of the lumbar spine, the lumbar spine is anatomically located in the middle and back of the human body. Therefore, the position where the lumbar spine is located can be predicted from the outer shape of the trunk, that is, the shape of the mask. Such statistical data can be stored in the storage device 300 in advance, and the imaging position calculation unit 232 estimates the position where the lumbar spine is located based on the statistical data stored in the storage device 300. In this manner, the accuracy of position prediction can be improved. The same applies to organs or tissues other than the lumbar spine. For the imaging position, the maximum and minimum coordinates of x and y of the specified mask (xy plane) are calculated, the center of each coordinate is set as a reference position, and the offset amount of the imaging target part with respect to the reference position (the amount of deviation of the estimated position of the imaging target part with respect to the imaging position) is calculated. The calculated offset amount is used for position correction in the capturing of a positioning image that is performed after the pre-scan.

<Step S406>

The scan parameter calculation unit 240 measures the extent of the subject from the mask image of the examination target part created in step S404 and masks other than the target, and based on this, calculates scan parameters (FOV, the ratio of the rectangular field of view, and the ratio of phase oversampling) that prevent artifacts and minimize the imaging time in the capturing of the positioning image.

Figure 8:
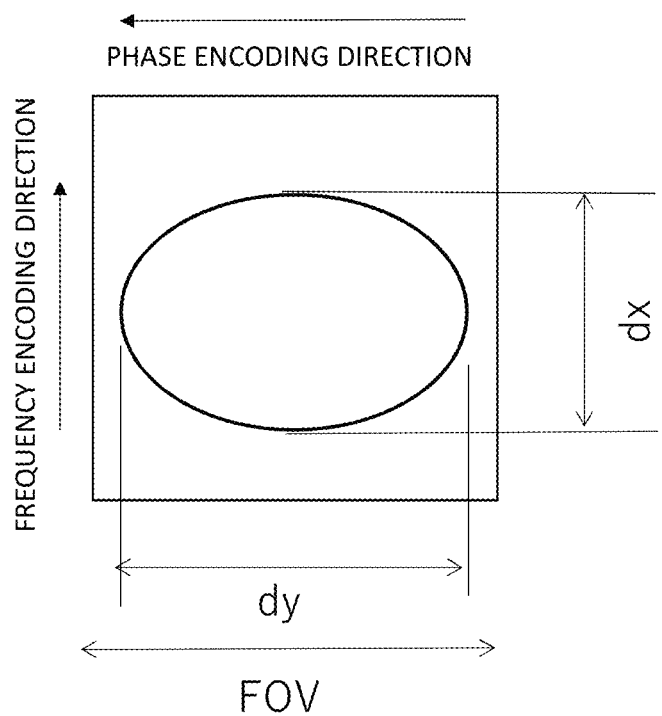
FIG. 8 is a diagram describing the calculation of a scan parameter (FOV)

In the measurement of the extent, as shown in FIG. 8, the widths dx and dy of the mask image in the x and y directions are calculated as the extent of the subject. That is, in Equation (3), the maximum and minimum coordinates of x and y at which Mask3 (x, y)=1 is obtained are calculated, and the distances dx and dy from the maximum and minimum coordinates in the x and y directions are calculated. As shown in FIG. 8, the FOV is set to a value obtained by multiplying the larger value of dx and dy by 1.2 (in this example, FOV=dy×1.2).

Figure 9B:
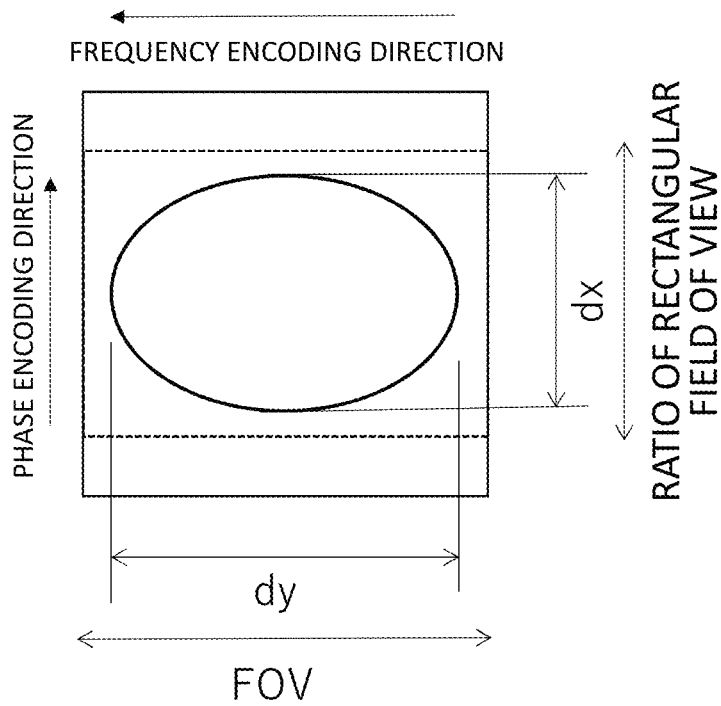
FIG. 9B is a diagram describing the calculation of a scan parameter (folding removal)
Figure 9A:
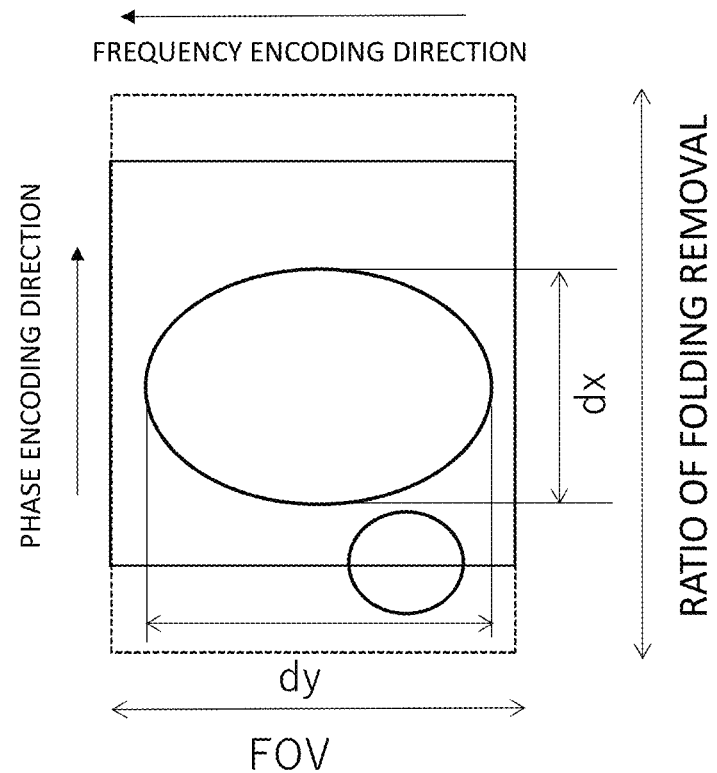
FIG. 9A is a diagram describing the calculation of a scan parameter (rectangular field of view)

For the ratio of the rectangular field of view, as shown in FIG. 9A, when the phase encoding direction is the x direction, the ratio r (r=dx/dy) is calculated by comparing 1.2 times the distance dx in the x direction (dx×1.2) with the value (in this example, dy×1.2) set as the FOV. When the ratio r is 1 time or less, the FOV is set to the "rectangular field of view". Alternatively, the value set in advance is updated.

For the ratio of folding removal, as shown in FIG. 9B, when a mask determined not to be a target is present outside the region of the value (in this example, dy×1.2) set as the FOV with respect to the phase encoding direction (in this example, x direction), the region including the non-target mask is set as the ratio of folding removal. Alternatively, the value set in advance is updated.

The ratio (antialiasing size) of the measured FOV enlarged for the folding removal is expressed by, for example, Equation (5).

[Equation 5]

$$\text{anti aliasing size} = \frac{Eff_z + 2 \times Off_z}{FOV} \quad (5)$$

In Equation (5), $Eff_z$ is the effective magnetic field space and $Off_z$ is the off-center amount.

In addition, the scan parameter calculation unit 240 can calculate the scan parameters (the number of slices and the slice thickness) of the main imaging using the extent (size) of the subject. Specifically, the number of slices is a value obtained by dividing the slice width by the distance corresponding to the slice direction, for example, the distance in the COR direction or the SAG direction in the case of the AX cross section (diagram on the right side in FIG. 10) and rounding down the fraction. The distance in the slice direction is adjusted based on whether the size of the subject is larger or smaller than the standard size with respect to the distance calculated from the number of slices and the slice thickness set by default depending on the examination part or the imaging target part (when there is no overlap, distance=number of slices×slice thickness).

<Step S407>

After completing the above-described process for the AX cross section (steps S402 to S406), when the SAG cross section or the COR cross section is further set in the pre-scan flow, the process returns to step S402 and the analysis processing of steps S403 to S406 is performed for the next cross section (the SAG cross section or the COR cross section). The content of the process is the same as that of the AX cross section. However, for the mask creation in step S403 (FIGS. 6: S601 to S605), step S604 for determining whether or not this part is a joint and step S605 for calculating the average brightness value are unnecessary, and the mask is created by the processing of steps S601 to S603. In addition, in the AX cross section, binarization processing using a threshold value and artifact removal processing using morphology transformation have been performed. However, instead of these processes, artifact removal using a Gaussian filter or a median filter and subject portion (sensitivity range) extraction may be performed.

In addition, when pre-scanning the SAG cross section or the COR cross section, the imaging position set first may be corrected by reflecting the imaging position obtained in the processing step S405 of the AX cross section. As a result, the accuracy of the extent of the subject obtained in the subsequent steps or the accuracy of the scan parameters calculated based on the extent can be improved.

The above-described processing from pre-scan imaging to scan parameter calculation (steps S402 to S406) is performed for all pre-scan cross sections set in the pre-scan flow control unit 212. This is automatically performed as a pre-scan.

<Step S408>

Positioning imaging and main imaging are performed by reflecting the imaging position calculated in step S405 and the scan parameters calculated in step S406. However, when the positional deviation of the imaging center with respect to the static magnetic field center is large and its correction is necessary, the bed is moved or the excitation position is adjusted. In addition, when an error occurs in the pre-scan, positioning imaging is performed using the processing results until then.

At the time of the main imaging, in order to set the position or the conditions of the main imaging, the image (scanogram) obtained by capturing the positioning image is displayed on the display of the UI unit 400. At this time, the image (scanogram) is displayed in a state in which information, such as a stack indicating the slice position or a position for detecting respiratory movements (position for collecting the navigator echo), is superposed on the image (scanogram). In addition, the scan parameters (the number of slices or the slice thickness) calculated by the pre-scan can also be displayed so that these can be checked and edited on the GUI.

Figure 11:
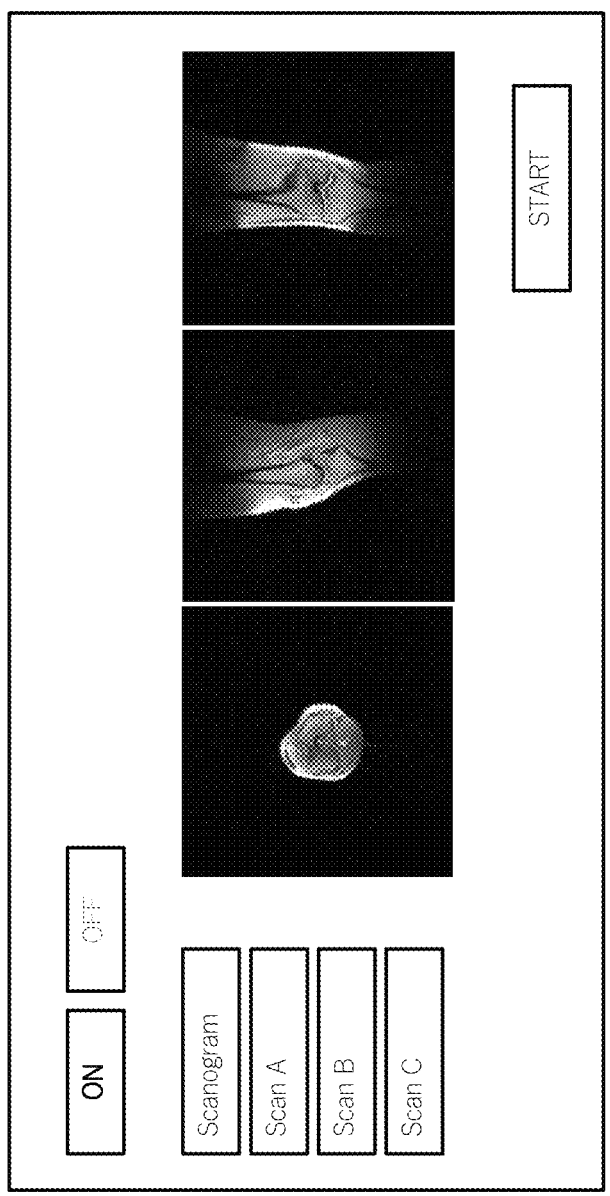
FIG. 11 is a diagram showing an example of a screen displayed in a UI unit.
Figure 12A:
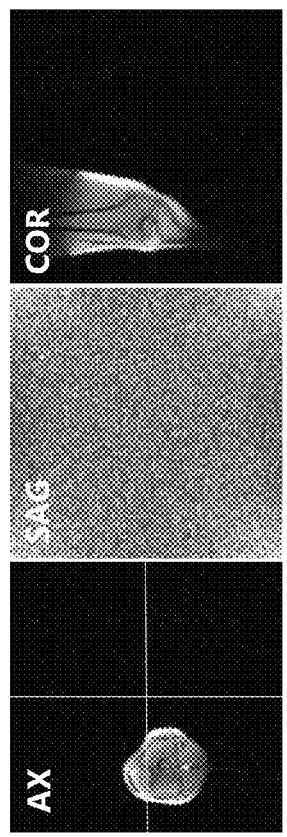
FIGS. 12A and 12B are diagrams describing a problem in the related art, where
Figure 12B:
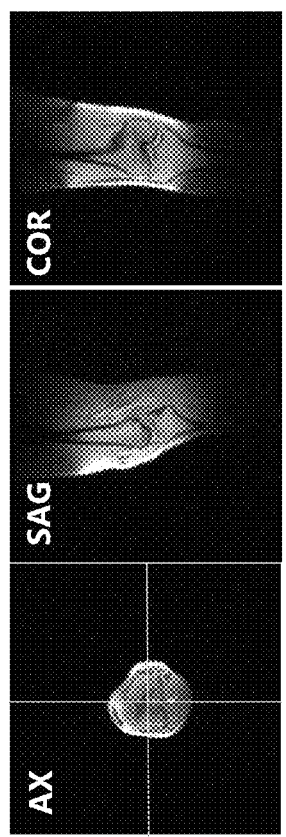

In the above description, the pre-scan is automatically performed prior to the positioning imaging. However, whether or not to perform the pre-scan may be selected by the user. For example, as shown in FIG. 11, on the GUI that displays the examination flow, a button for switching between application (ON) and non-application (OFF) of the functions (pre-scan and scan parameter calculation) of the present embodiment may be displayed, and the pre-scan may be performed only when application is selected.

As described above, according to the present embodiment, in order to optimize the offset amount of the imaging position regardless of the body shape or posture of the subject, positioning imaging at a position not intended by the user and re-imaging due to the positioning imaging can be prevented. As a result, it is possible to improve the examination accuracy. In addition, according to the present embodiment, the parameters changed by the user for each subject at the time of imaging can be automatically calculated, and a state in which the various parameters have been changed to the calculated values can be displayed for user. As a result, it is possible to perform automatic imaging.

What is claimed is:

1. A magnetic resonance imaging apparatus, comprising:
an imaging unit that images a predetermined examination part of a subject according to imaging conditions stored in a storage device that stores imaging conditions for each examination part; and a calculation unit that controls an operation of the imaging unit and performs a calculation related to imaging, wherein the calculation unit controls the imaging unit to acquire a pre-scan image for measuring an extent of the examination part of the subject and calculates the extent of the examination part using measurement data obtained by the pre-scan, wherein the pre-scan image is an axial cross section of the subject, wherein the calculation unit creates a mask image of the examination part from the measurement data obtained by the pre-scan, and calculates the extent of the examination part from the mask image, wherein the mask image is created by:

binarizing the cross section image based on a brightness signal strength of the cross section image, and removing artifacts from the binarized image by a morphology transformation that repeatedly alternates a dilation processing and an erosion processing.

2. The magnetic resonance imaging apparatus according to claim 1, wherein the calculation unit corrects an imaging position of a positioning image by the imaging unit using the calculated extent of the examination part.

3. The magnetic resonance imaging apparatus according to claim 2, wherein the calculation unit includes a scan parameter calculation unit that calculates scan parameters for imaging by the imaging unit using the calculated extent of the examination part.

4. The magnetic resonance imaging apparatus according to claim 3, wherein the scan parameters include at least one of an FOV, a ratio of folding removal, a ratio of a rectangular field of view, the number of slices, and a slice thickness.

5. The magnetic resonance imaging apparatus according to claim 3, further comprising:

a user interface unit that receives an instruction from a user and outputs a processing result of the calculation unit, wherein the user interface unit outputs scan parameters adjusted by the calculation unit to present the scan parameters to the user and receives changes in the scan parameters by the user.

6. The magnetic resonance imaging apparatus according to claim 1, wherein the calculation unit calculates a height and a width of the examination part in the axial cross section.

7. The magnetic resonance imaging apparatus according to claim 1, wherein the calculation unit calculates a profile (one-dimensional projection image) of the coronal cross section or the sagittal cross section, and calculates the extent of the examination part from the profile.

8. A non-transitory compute readable medium storing a program for controlling an operation of a magnetic resonance imaging apparatus including an imaging unit that images a predetermined examination part of a subject according to imaging conditions stored in a storage device that stores imaging conditions for each examination part, the program causing a computer to execute:

a step of causing the imaging unit to acquire a pre-scan image for measuring an extent of an examination part of the subject;

a step of calculating the extent of the examination part for an axial surface of the subject and a surface perpendicular to the axial surface using measurement data obtained by the pre-scan; and a step of calculating imaging conditions when the imaging unit images the examination part using the calculated extent of the examination part, wherein the pre-scan image is an axial cross section of the subject, wherein the calculation unit creates a mask image of the examination part from the measurement data obtained by the pre-scan, and calculates the extent of the examination part from the mask image, wherein the mask image is created by:

binarizing the cross section image based on a brightness signal strength of the cross section image, and removing artifacts from the binarized image by a morphology transformation that repeatedly alternates a dilation processing and an erosion processing.

* * * * *